(12) United States Patent
Cho

(10) Patent No.: US 6,522,900 B1
(45) Date of Patent: Feb. 18, 2003

(54) METHOD FOR DISPLAYING BATTERY VOLTAGE IN TDMA RADIO TERMINAL

(75) Inventor: Sung-Min Cho, Kumi-shi (KR)

(73) Assignee: Samsung Electronics, Co., Ltd. (KR)

( * ) Notice: Subject to any disclaimer, the term of this patent is extended or adjusted under 35 U.S.C. 154(b) by 0 days.

(21) Appl. No.: 09/209,410

(22) Filed: Dec. 10, 1998

(30) Foreign Application Priority Data

Dec. 16, 1997 (KR) .............................. 97-69200

(51) Int. Cl.$^7$ ............................ H04G 1/38; H04M 1/00
(52) U.S. Cl. ...................... 455/572; 455/566; 455/127; 340/636
(58) Field of Search ................................ 455/572, 127, 455/115, 566, 425, 573, 574, 343, 226.4; 370/311, 347; 340/636; 320/124, 125, 134, 162, 163

(56) References Cited

U.S. PATENT DOCUMENTS 5,613,227 A * 3/1997 Maki .......................... 455/127

FOREIGN PATENT DOCUMENTS

FR  2 335 063  7/1977

* cited by examiner

Primary Examiner—Vivian Chin
Assistant Examiner—James Moore
(74) Attorney, Agent, or Firm—Dilworth & Barrese, LLP

(57) ABSTRACT

A method for displaying a battery voltage in a Time Division Multiple Access (TDMA) radio terminal is provided. The method includes the steps of detecting the battery voltage. A battery state corresponding to one of a plurality of battery state areas is displayed, when the battery voltage corresponds to one of the plurality of battery state areas. On the other hand, a previous battery state is displayed, when the battery voltage corresponds to one of a plurality of buffer zones. Each of the plurality of buffer zones are disposed between two of the plurality of battery state areas. The battery state being currently displayed is then stored as a previous battery state.

11 Claims, 6 Drawing Sheets

METHOD FOR DISPLAYING BATTERY VOLTAGE IN TDMA RADIO TERMINAL

BACKGROUND OF THE INVENTION

1. Field of the Invention

The present invention relates to Time Division Multiple Access (TDMA) radio terminals and, in particular, to a method for stably displaying a battery voltage which temporarily varies during transmission and reception periods in a TDMA radio terminal.

2. Description of the Related Art

In general, a radio terminal such as a cordless telephone has a battery state displaying function for measuring a current battery voltage and displaying the battery state on a liquid crystal display (LCD). The battery state is generally displayed in the following increments so that a user may recognize the present battery state: a full battery state, a half battery state, a low battery state and an empty battery state.

FIGS. 1 and 2 are diagrams respectively illustrating variations of the current consumption and the battery voltage during transmission and reception periods in a TDMA radio terminal. As shown in FIG. 1, in a TDMA radio terminal such as a Digital European Cordless Telephone (DECT), current consumption abruptly increases during transmission (Tx) and reception (Rx). Correspondingly, the battery voltage also abruptly changes during transmission and reception, as shown in FIG. 2. Accordingly, it is difficult to stably display the battery voltage due to the continual variation of the battery voltage.

A conventional method for displaying battery voltage in a TDMA radio terminal will be described with respect to FIGS. 3 and 4. FIG. 3 is a diagram illustrating battery state areas in the conventional TDMA radio terminal, and FIG. 4 is a diagram illustrating a changing battery voltage with respect to a threshold level corresponding to two battery state areas. As shown in FIG. 3, the battery state is divided into four areas: a full battery state area, a half battery state area, a low battery state area and an empty battery state area. Conventionally, when the battery voltage exceeds a first threshold level (for the low battery state), the TDMA radio terminal displays the low battery state on the display, and when the battery voltage is lower than the first threshold level, the TDMA radio terminal displays the empty battery state. However, such a conventional method cannot stably display the battery state due to the continual variation of the battery voltage during the transmission and reception periods.

For example, assume that a battery voltage 411 changes during transmission and reception such that voltage 411 swings on (i.e., swings above and below) the first threshold level 412, as shown in FIG. 4. In such a case, the TDMA radio terminal displays the low battery state in an idle state and the empty battery state during transmission and reception due to the temporal change of the battery voltage. As a result, as transmission and reception are repeated at intervals, the terminal repeatedly changes the battery state, which decreases reliability of the battery state display function.

SUMMARY OF THE INVENTION

It is therefore an object of the present invention to provide a method for stably displaying a battery voltage which temporarily varies during transmission and reception periods in a TDMA radio terminal.

A method for displaying a battery voltage in a Time Division Multiple Access (TDMA) radio terminal is provided. The method includes the step of detecting the battery voltage. A battery state corresponding to one of a plurality of battery state areas is displayed, when the battery voltage corresponds to one of the plurality of battery state areas. On the other hand, a previous battery state is displayed, when the battery voltage corresponds to one of a plurality of buffer zones. Each of the plurality of buffer zones are disposed between two of the plurality of battery state areas. The battery state being currently displayed is then stored as a previous battery state.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

A preferred embodiment of the present invention will be described hereinbelow with reference to the accompanying drawings. In the following description, well known functions or constructions are not described in detail so as not to obscure the invention in unnecessary detail. In the specification, the term "buffer zone" refers to a zone intervening between (i.e., disposed between) two adjacent battery state areas.

Figure 1:
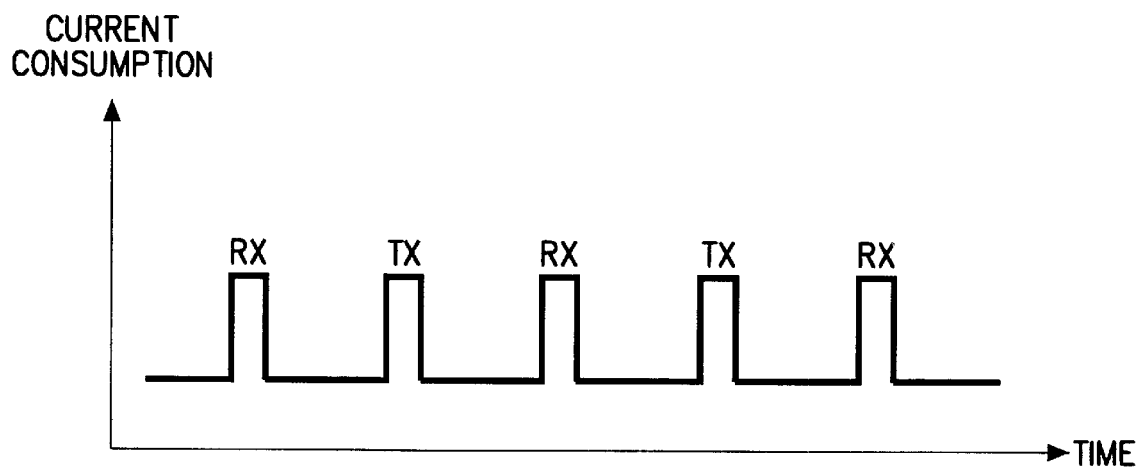
FIG. 1 is a diagram illustrating variation of current consumption in a common TDMA radio terminal.
Figure 2:
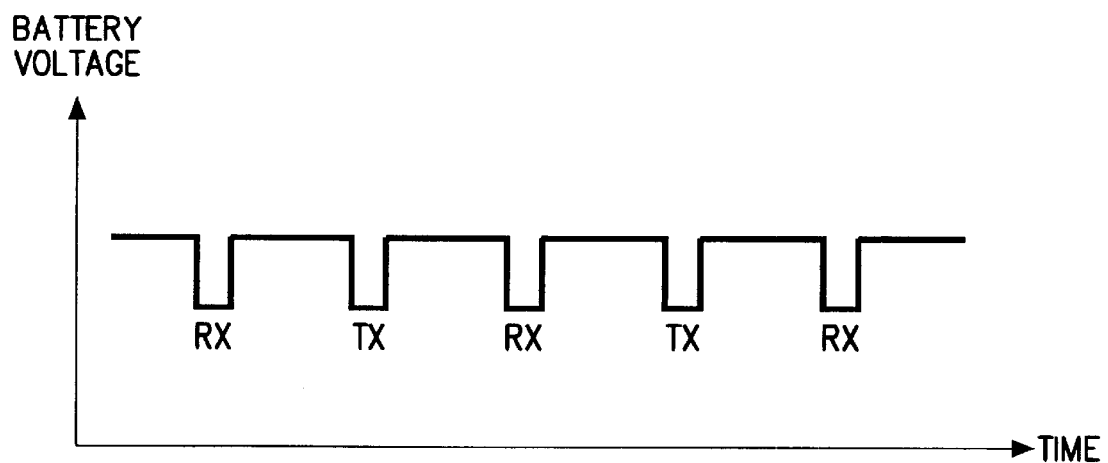
FIG. 2 is a diagram illustrating variation of a battery voltage in a common TDMA radio terminal.
Figure 3:
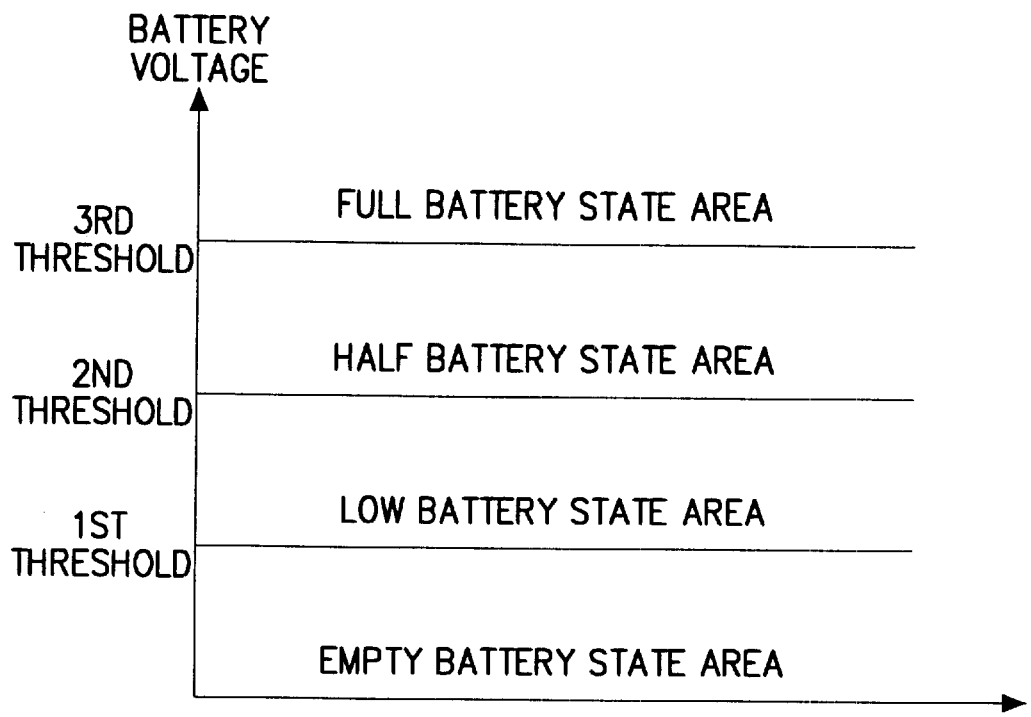
FIG. 3 is a diagram illustrating threshold levels of the battery states in a conventional TDMA radio terminal.
Figure 4:
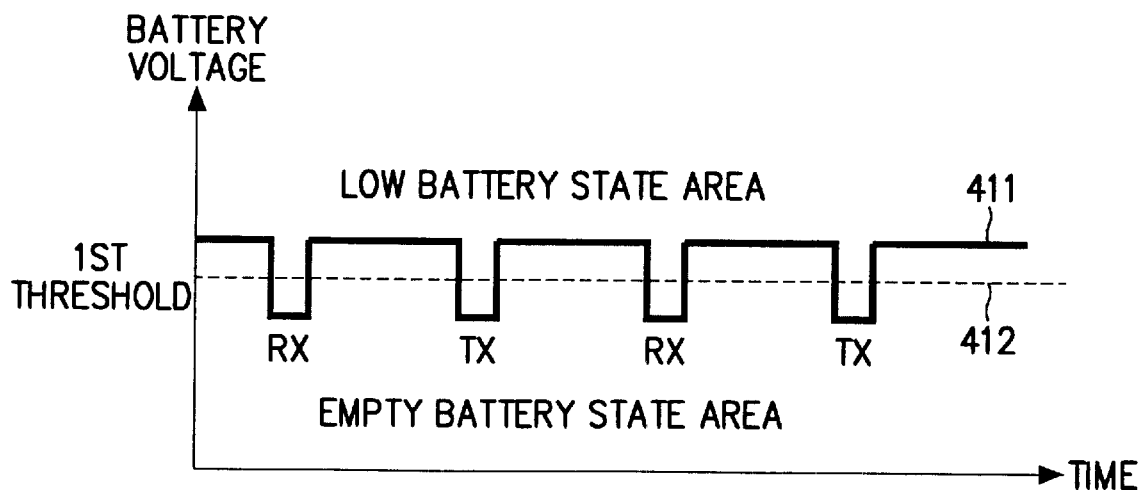
FIG. 4 is a diagram illustrating a changing battery voltage with respect to a threshold level corresponding to two battery state areas.
Figure 5:
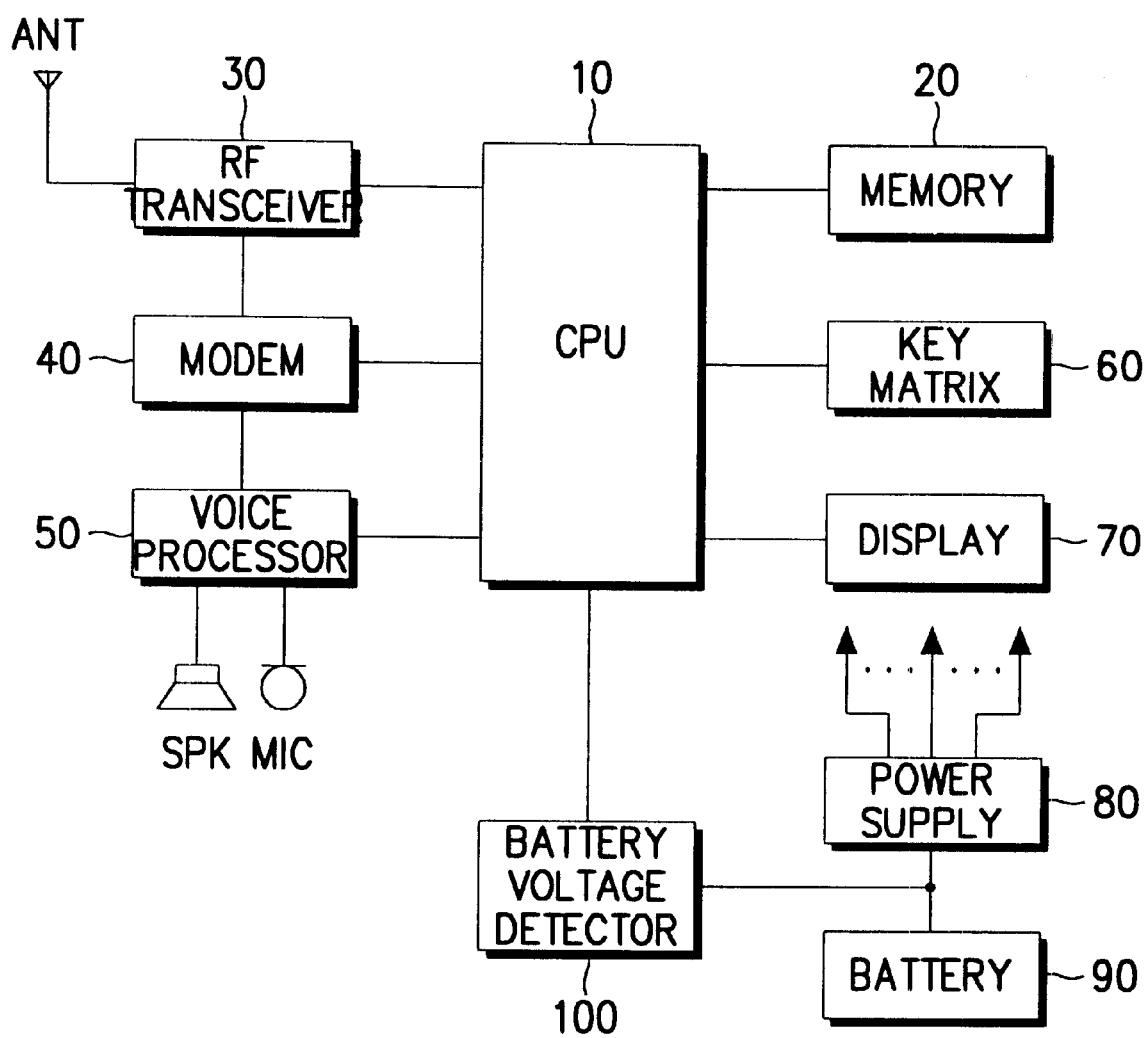
FIG. 5 is a block diagram of a TDMA radio terminal to which the present invention is applied.

FIG. 5 illustrates a block diagram of a TDMA radio terminal to which the present invention is applied. A controller or Central Processing Unit (CPU) 10 is operatively coupled to an RF (Radio Frequency) transceiver 30, a modem 40, a voice processor 50, a memory 20, a key matrix (or key input unit) 60, a display 70, and a battery voltage detector 100. The RF transceiver 30 is also operatively coupled to an antenna ANT and modem 40. The voice processor 50 is also operatively coupled to a speaker (or earpiece) SPK, a microphone (or mouthpiece) MIC, and modem 40. The battery voltage detector 100 is also operatively coupled to a battery 90 and a power supply 80.

The CPU 10 controls the overall operations of the TDMA radio terminal. In particular, CPU 10 measures a battery voltage based upon a battery voltage detection signal output from battery voltage detector 100, and displays a corresponding battery state on display 70. The memory 20 includes a ROM (Read Only Memory) for storing a program for controlling the radio terminal and a RAM (Random Access Memory) for temporarily storing data generated during execution of the program.

The voice processor 50 converts an analog voice signal input from microphone MIC to Adaptive Differential Pulse Code Modulation (ADPCM) data, and processes a signal input from modem 40 to a voice signal to output the voice signal to speaker SPK. The modem 40 converts the ADPCM data input from voice processor 50 to a baseband signal to output the baseband signal to RF transceiver 30, and converts a signal input from RF transceiver 30 to digital data to output the digital data to voice processor 50. The RF transceiver 30 converts the analog baseband signal input from modem 40 to an RF signal to send the RF signal to a fixed part FP (or base unit) through a radio channel, and down-converts an RF signal received through antenna ANT to an analog baseband signal to output the analog baseband signal to modem 40.

The key matrix 60, which includes a plurality of numeric keys, provides CPU 10 with key data generated by the user's key manipulation. The display 70 (for example, an LCD), under the control of CPU 10, displays operating states of the radio terminal (or portable unit). Further, display 70 displays a battery state in response to battery state display data output from CPU 10.

The power supply 80 is provided with a power supply voltage from battery 90 and decreases the power supply voltage to specified levels for the respective parts. The battery 90, which is normally put on the fixed part FP (not shown), is charged with a charge voltage supplied from the fixed part FP and provides the battery voltage to power supply 80. The battery voltage detector 100 detects the voltage level of battery 90 and provides a corresponding battery voltage detection signal to CPU 10. The battery voltage detector 100 includes an analog-to-digital (A/D) convertor for converting an analog voltage level signal from battery 90 to digital data.

Figure 6:
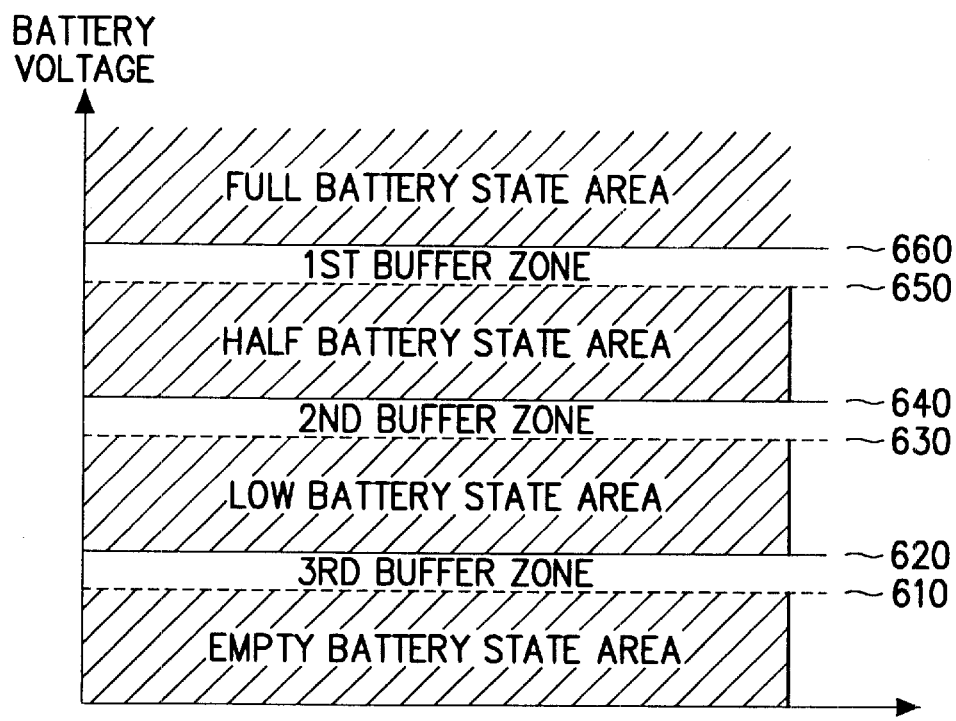
FIG. 6 is a diagram illustrating threshold levels for the respective battery states according to an embodiment of the present invention.

FIG. 6 is a diagram illustrating threshold levels for the respective battery states according to an embodiment of the present invention. As illustrated, the battery state according to the present invention is divided into a full battery state area, a half battery state area, a low battery state area and an empty battery state area, wherein buffer zones intervene between adjacent battery state areas. Specifically, a first buffer zone intervenes between the full battery state area and the half battery state area, a second buffer zone intervenes between the half battery state area and the low battery state area, and a third buffer zone intervenes between the low battery state area and the empty battery state area. Further, the first to third buffer zones each have upper limits or thresholds (660, 640 and 620) and lower limits or thresholds (650, 630 and 610), respectively. That is, the entire battery state area is divided into four battery state areas and three buffer zones.

The CPU 10 determines whether or not the battery voltage detected by battery voltage detector .100 corresponds to any one of the four battery state areas. If so, CPU 10 displays the corresponding battery state. However, when the detected battery voltage corresponds to any one of the three buffer zones, CPU 10 judges on which limit of a specific buffer zone the detected battery voltage swings. If the battery voltage swings on the upper limit of the specific buffer zone, CPU 10 displays the battery state corresponding to the battery state area situated over the above stated upper limit. However, when the battery voltage swings on the lower limit of the specific buffer zone, CPU 10 displays the battery state corresponding to the battery state area situated below the above stated lower limit. Here, it is preferable that a width of the buffer zones should be wider than a variation width of the battery voltage during transmission and reception.

Figure 7:
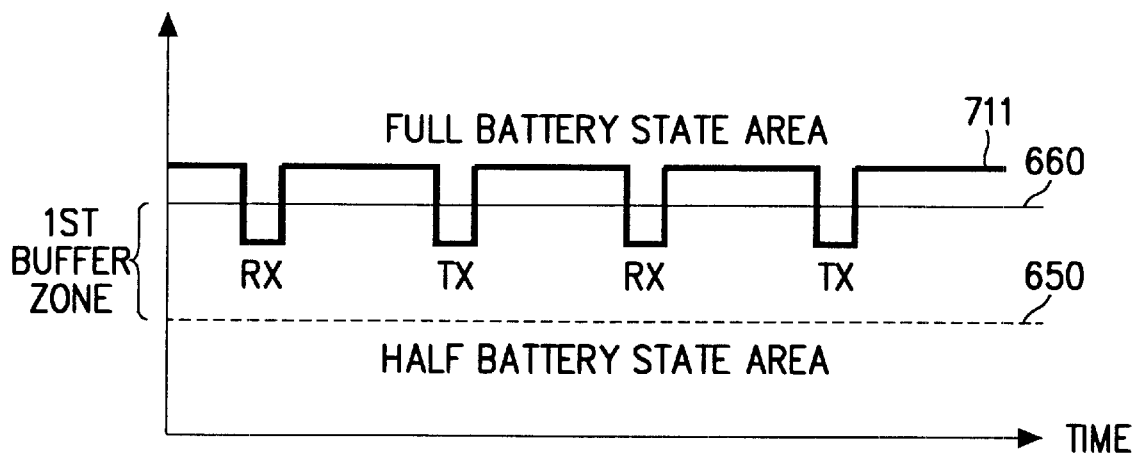
FIG. 7 is a diagram illustrating a state wherein a battery voltage swings on a threshold level during transmission and reception.
Figure 8A:
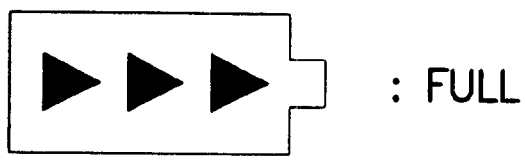
FIGS. 8A to 8D are diagrams illustrating icons indicating a full battery state, a half battery state, a low battery state and an empty battery state, respectively.
Figure 8B:
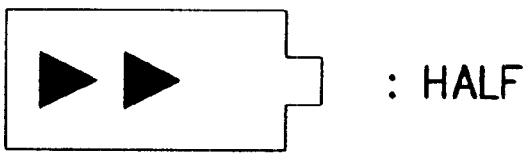
Figure 8C:
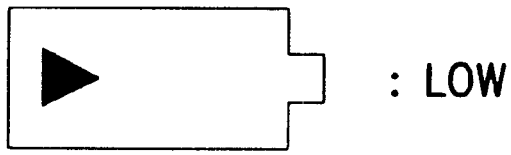
Figure 8D:
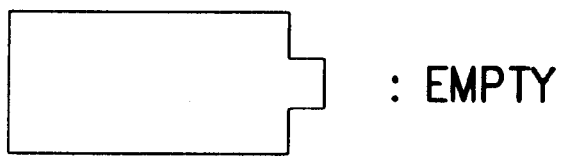

FIG. 7 is a diagram illustrating a state wherein a battery voltage swings on a threshold level during transmission and reception. Referring to FIG. 7, assume that a battery voltage 711 is varied during transmission and reception, swinging on the upper limit 660 of the first buffer zone. That is, the battery voltage corresponds to the first buffer zone during transmission and reception, while it corresponds to the full battery state area during the idle state. In such a case, CPU 10 displays the full battery state, unless the battery voltage drops to the lower limit 650 of the first buffer zone during transmission and reception.

FIGS. 8A to 8D illustrate icons displayed on display 70 for indicating the full battery state, the half battery state, the low battery state and the empty battery state, respectively.

Figure 9:
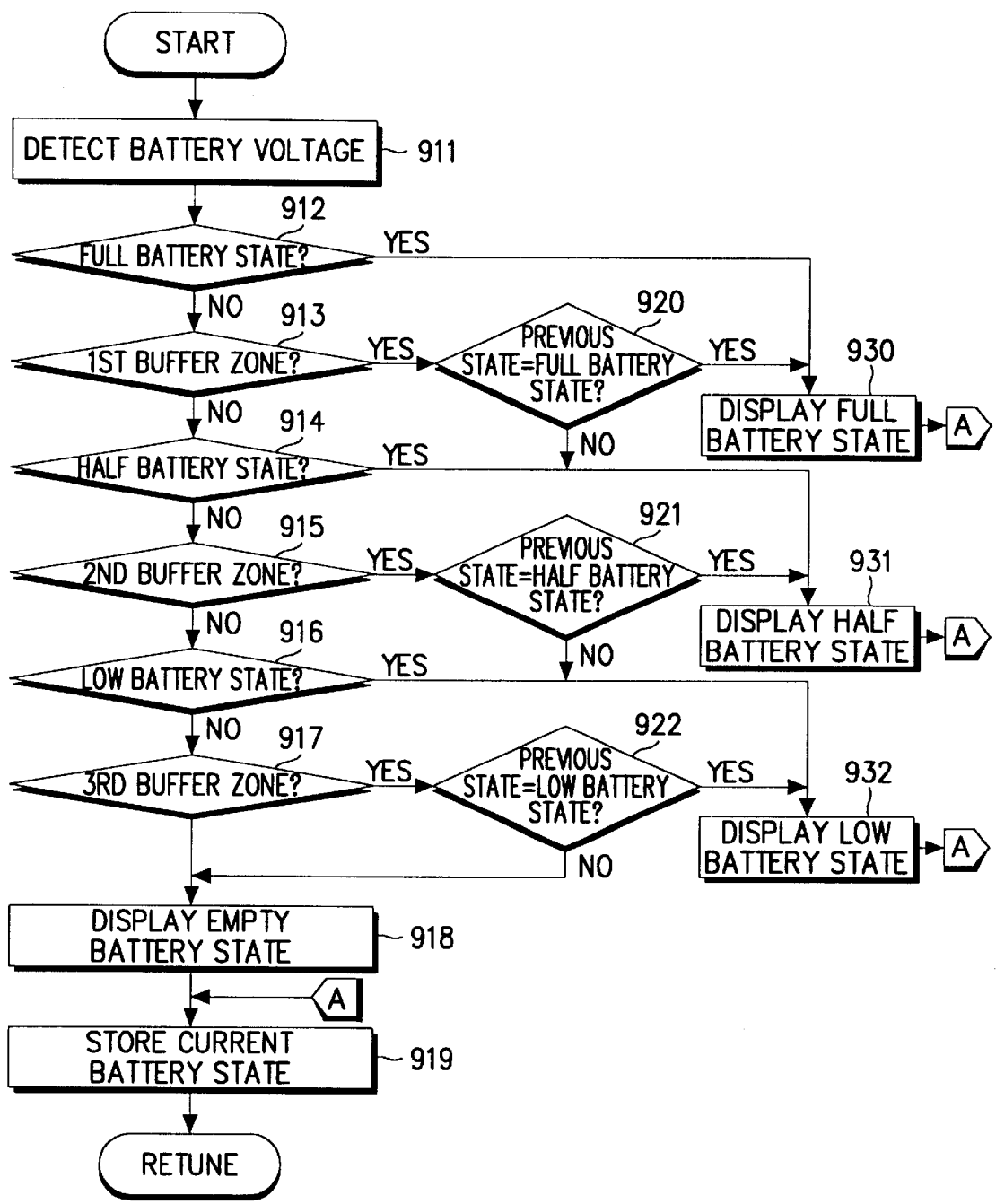
FIG. 9 is a flowchart illustrating a method for displaying a battery voltage according to an embodiment of the present invention.

FIG. 9 is a flowchart illustrating a method for displaying a battery voltage according to an embodiment of the present invention. The CPU 10 receives the battery voltage detection signal output from battery voltage detector 100 (step 911). The CPU 10 then judges whether or not the battery voltage corresponds to the full battery state area (step 912). If the battery voltage corresponds to the full battery state area, CPU 10 displays the full battery state (step 930) and then proceeds to step 919. However, if the battery voltage does not correspond to the full battery state area, then CPU 10 judges whether or not the battery voltage corresponds to the first buffer zone (step 913). If the battery voltage corresponds to the first buffer zone, then CPU 10 judges whether or not a previous battery state is the full battery state (step 920). If the previous battery state is the full battery state, CPU 10 displays the full battery state (step 930) and then proceeds to step 919. However, if the previous battery state is not the full battery state, CPU 10 displays the half battery state on display 70 (step 931) and then proceeds to step 919.

However, when the battery voltage does not correspond to the first buffer zone in step 913, CPU 10 judges whether. or not the battery voltage corresponds to the half battery state area (step 914). If the battery voltage corresponds to the half battery state area, CPU 10 displays the half battery state (step 931) and then proceeds to step 919. However, if the battery voltage does not correspond to the half battery state area, CPU 10 judges whether or not the battery voltage corresponds to the second buffer zone (step 915). If the battery voltage corresponds to the second buffer zone, then CPU 10 judges whether or not the previous battery state is the half battery state (step 921). If the previous battery state is the half battery state, CPU 10 displays the half battery state (step 931) and then proceeds to step 919. However, if the previous battery state is not the half battery state, CPU 10 displays the low battery state on display 70 (step 932) and then proceeds to step 919.

However, when the battery voltage does not correspond to the second buffer zone in step 915, CPU 10 judges whether or not the battery voltage corresponds to the low battery state area (step 916). If the battery voltage corresponds to the low battery state area, CPU 10 displays the low battery state (step 932) and then proceeds to step 919. However, if the battery voltage does not correspond to the low battery state area, CPU 10 judges whether or not the battery voltage corresponds to the third buffer zone (step 917). If the battery voltage does not corresponds to the third buffer zone, CPU 10 displays the empty battery state (step 918). However, if the battery voltage corresponds to the third buffer zone, CPU 10 judges whether or not the previous battery state is the low battery state (step 922). If the previous battery state is the low battery state, CPU 10 displays the low battery state (step 932) and then proceeds to step 919. However, if the previous battery state is not the low battery state, CPU 10 displays the empty battery state on display 70 (step 918) and then proceeds to step 919. In step 919, CPU 10 stores the battery state being currently displayed as a previous battery state and then returns to step 911.

As described above, the TDMA radio terminal of the invention can stably display the battery state, even though the battery voltage temporarily varies during transmission and reception periods.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. method for displaying a battery voltage in a TDMA (Time Division Multiple Access) radio terminal, comprising the steps of:

detecting the battery voltage;

judging whether the battery voltage swings on a threshold level corresponding to a transition from a first battery state area to a buffer zone between the first battery state area and a second battery state area, the first and second battery state areas respectively associated with a first and a second battery state, the first battery state area being disposed above the second battery state area; and displaying the first battery state, when the battery voltage swings on the threshold level and remains within the buffer zone.

2. The method of claim 1, wherein the first and second battery state areas are one of a full battery state and a half battery state, the half battery state and a low battery state, and the low battery state and an empty battery state.

3. The method of claim 1, wherein the first battery state corresponds to a previously stored battery state.

4. A method for displaying a battery voltage in a TDMA (Time Division Multiple Access) radio terminal, comprising the steps of:

detecting the battery voltage;

judging whether the battery voltage corresponds to one of a plurality of predefined battery state areas, each of the plurality of predefined battery state areas respectively associated with one of a plurality of predefined battery states;

displaying one of the plurality of battery states respectively associated with one of the plurality of battery state areas and corresponding to the battery voltage, when the battery voltage corresponds to one of the plurality of battery state areas;

judging whether the battery voltage swings between one of the plurality of battery state areas and one of a plurality of buffer zones, each of the plurality of buffer zones disposed between two of the plurality of predefined battery state areas, when the battery voltage does not correspond to one of a plurality of predefined battery state areas;

judging whether one of the plurality of battery states associated with one of the plurality of battery state areas that the battery voltage is swinging between has been previously stored, when the battery voltage swings between one of the plurality of battery state areas and one of the plurality of buffer zones;

displaying the previously stored one of the plurality of battery state areas, when one of the plurality of battery states associated with one of the plurality of battery state areas that the battery voltage is swinging between has been previously stored; and displaying one of the plurality of battery states associated with one of the plurality of battery state areas that is disposed below one of the plurality of battery state areas that the battery voltage is swinging between.

5. The method of claim 4, further comprising the step of storing the displayed one of the plurality of battery states.

6. A method for displaying a battery voltage in a TDMA radio terminal, comprising the steps of:

detecting the battery voltage;

displaying a first battery state corresponding to a first battery state area, when the battery voltage swings on an upper limit of a buffer zone intervening between the first battery state area and a second battery state area being situated below the first battery state area; and displaying a second battery state corresponding to the second battery state area, when the battery voltage swings on a lower limit of the buffer zone.

7. A method for displaying a battery voltage in a TDMA radio terminal, comprising the steps of:

detecting the battery voltage;

displaying a battery state corresponding to one of a plurality of battery state areas, when the battery voltage corresponds to one of the plurality of battery state areas; and displaying a previous battery state, when the battery voltage corresponds to one of a plurality of buffer zones, each of the plurality of buffer zones disposed between two of the plurality of battery state areas.

8. The method of claim 7, further comprising the step of storing the battery state being currently displayed as the previous battery state.

9. A method for displaying a battery voltage in a TDMA radio terminal, comprising the steps of:

detecting the battery voltage;

judging whether the battery voltage corresponds to one of first to fourth battery state areas;

displaying a first battery state corresponding to the first battery state area, when the battery voltage corresponds to the first battery state area;

judging whether a previous battery state is the first battery state, when the battery voltage corresponds to a first buffer zone intervening between the first and second battery state areas, displaying the first battery state when the previous battery state is the first battery state, displaying the first battery state when the battery voltage is swinging between the first battery state area and the first buffer zone, and displaying a second battery state when the battery voltage is swinging between the first buffer zone and the second battery state area;

displaying the second battery state corresponding to the second battery state area, when the battery state corresponds to the second battery state area;

judging whether the previous battery state is the second battery state, when the battery voltage corresponds to a second buffer zone intervening between the second and third battery state areas, displaying the second battery state when the previous battery state is the second battery state, displaying the second battery state when the battery voltage is swinging between the second battery state area and the second buffer zone, and displaying a third battery state when the battery voltage is swinging between the second buffer zone area and the third battery state area;

displaying the third battery state corresponding to the third battery state area, when the battery state corresponds to the third battery state area; and judging whether the previous battery state is the third battery state, when the battery voltage corresponds to a third buffer zone intervening between the third and fourth battery state areas, displaying the third battery state when the previous battery state is the third battery state, and displaying the third battery state when the battery voltage is swinging between the third battery state area and the third buffer zone, and displaying a fourth battery state when the battery voltage is swinging between the third buffer zone and the fourth battery state area.

10. The method of claim 9, further comprising the step of storing th e battery state being currently displayed as the previous battery state.

11. The method of claim 9, wherein the first to fourth battery states are a full battery state, a half battery state, a low battery state and an empty battery state, respectively.

* * * * *